United States Patent [19]
Hatwar et al.

[11] Patent Number: 6,127,004
[45] Date of Patent: Oct. 3, 2000

[54] FORMING AN AMORPHOUS FLUOROCARBON LAYER IN ELECTROLUMINESCENT DEVICES

[75] Inventors: Tukaram K. Hatwar, Penfield; Gopalan Rajeswaran, Fairport; Vincent N. Botticelli, Hemlock; Stephen P. Barry, Albion, all of N.Y.

[73] Assignee: Eastman Kodak Company, Rochester, N.Y.

[21] Appl. No.: 09/240,272

[22] Filed: Jan. 29, 1999

[51] Int. Cl.$^7$ ...................................................... H05H 1/00
[52] U.S. Cl. .......................... 427/535; 427/569; 427/402; 427/255.7; 427/162
[58] Field of Search ..................................... 427/535, 569, 427/402, 255.7, 66, 162

[56] References Cited

U.S. PATENT DOCUMENTS

| | | |
|---|---|---|
| 3,172,862 | 3/1965 | Gurnee et al. . |
| 3,173,050 | 3/1965 | Gurnee . |
| 3,180,730 | 4/1965 | Klupfel et al. . |
| 3,567,450 | 3/1971 | Brantly et al. . |
| 3,658,520 | 4/1972 | Brantly et al. . |
| 3,710,167 | 1/1973 | Dresner et al. . |
| 4,356,429 | 10/1982 | Tang . |
| 4,539,507 | 9/1985 | VanSlyke et al. . |
| 4,720,432 | 1/1988 | VanSlyke et al. . |
| 4,769,292 | 9/1988 | Tang et al. . |
| 4,885,211 | 12/1989 | Tang et al. . |
| 4,950,950 | 8/1990 | Perry et al. . |
| 5,047,687 | 9/1991 | VanSlyke . |
| 5,059,861 | 10/1991 | Littman et al. . |
| 5,061,569 | 10/1991 | VanSlyke et al. . |
| 5,073,446 | 12/1991 | Scozzafava et al. . |
| 5,141,671 | 8/1992 | Bryan et al. . |
| 5,150,006 | 9/1992 | VanSlyke et al. . |
| 5,151,629 | 9/1992 | VanSlyke . |
| 5,457,565 | 10/1995 | Namiki et al. ........................... 359/273 |
| 5,776,622 | 7/1998 | Hung et al. . |
| 5,834,894 | 11/1998 | Shirasaki et al. ........................ 313/509 |
| 5,909,081 | 6/1999 | Eida et al. ............................... 313/504 |
| 6,020,078 | 2/2000 | Chen et al. ............................. 428/690 |

OTHER PUBLICATIONS

"Organic Electroluminescent Devices with Improved Stability" by S. A. VanSlyke, C. H. Chen and C. W. Tang, Applied Physics Letters, vol. 69(15), (Oct. 1996), pp. 2160–2162.

"Enhanced Performance of Polymer Light–Emitting Diodes Using High–Surface Area Polyaniline Network Electrodes" by Y. Yang, E. Westerweele, C. Zhang, P. Smith and A. J. Heeger, Journal of Applied Physics letters, vol. 77(2), (Jan. 1995), pp. 694–698.

"Surface Modification of Indium Tin Oxide by Plasma Treatment: an Effective Method to Improve the Efficiency, Brightness, and Reliability of Organic Light Emitting Devices" by C. C. Wu, C. I. Wu, J. C. Sturm, and A. Kahn, Applied Physics Letters, vol. 70(11), (Mar. 1997) pp. 1348–1350.

*Primary Examiner*—Roy V. King
*Attorney, Agent, or Firm*—Raymond L. Owens

[57] ABSTRACT

A method of forming an electroluminescent device comprising the steps of providing a substrate having a top surface coating with a material including an anode having indium-tin-oxide; and forming an amorphous conductive layer over the anode by providing a fluorocarbon gas in a radical source cavity and subjecting such fluorocarbon gas to a reduced pressure in a range of 0.1 to 20 MT; applying an RF field across the fluorocarbon gas in the radical source cavity to form a plasma having $CF_x$ radicals; depositing the $CF_x$ radicals onto the anode forming an amorphous $CF_x$ conductive polymer layer on the anode; and forming a plurality of layers over the amorphous $CF_x$ conductive polymer layer with such layers including at least one organic electroluminescent layer and a cathode over the electroluminescent layer.

7 Claims, 11 Drawing Sheets

FORMING AN AMORPHOUS FLUOROCARBON LAYER IN ELECTROLUMINESCENT DEVICES

CROSS REFERENCE TO RELATED APPLICATIONS

Reference is made to commonly assigned U.S. patent application Ser. No. 09/191,705 filed Nov. 13, 1998, entitled "A Multistructured Electrode for Use with Electroluminescent Devices" by Hung et al., the disclosure of which is incorporated herein.

FIELD OF THE INVENTION

This invention relates to a method of making electroluminescent devices and more particularly to a method of forming an amorphous fluorocarbon layer in such devices.

BACKGROUND OF THE INVENTION

Organic EL devices are known to be highly efficient and are capable of producing a wide range of colors. Useful applications such as flat-panel displays have been contemplated. Representative of earlier organic EL devices are Gurnee et al. U.S. Pat. No. 3,172,862, issued Mar. 9, 1965; Gurnee U.S. Pat. No. 3,173,050, issued Mar. 9, 1965; and Dresner U.S. Pat. No. 3,710,167, issued Jan. 9, 1973. Typical organic emitting materials were formed of a conjugated organic host material and a conjugated organic activating agent having condensed benzene rings. The organic emitting material was present as a single layer medium having a thickness much above 1 micrometer. Thus, this organic EL medium was highly resistive and the EL device required an extremely high voltage (>100 volts) to operate.

The most recent discoveries in the art of organic EL device construction have resulted in devices having the organic EL medium consisting of extremely thin layers (<1.0 micrometer in combined thickness) separating the anode and cathode. The thin organic EL medium offers reduced resistance, permitting higher current densities for a given level of electrical bias voltage. In a basic two-layer EL device structure, one organic layer is specifically chosen to inject and transport holes and the other organic layer is specifically chosen to inject and transport electrons. The interface between the two layers provides an efficient site for the recombination of the injected hole-electron pair and resultant electroluminescence. Examples are provided by U.S. Pat. Nos. 4,356,429; 4,539,507; 4,720,432; 4,885,211; 4,950,950; 5,047,687; 5,059,861; 5,061,569; 5,073,446; 5,141,671; 5,150,006; and 5,151,629.

The simple structure can be modified to a three-layer structure, in which an additional electroluminescent layer is introduced between the hole and electron transporting layers to function primarily as the site for hole-electron recombination and thus electroluminescence. In this respect, the functions of the individual organic layers are distinct and can therefore be optimized independently. Thus, the electroluminescent or recombination layer can be chosen to have a desirable EL color as well as a high luminance efficiency. Likewise, the electron and hole transport layers can be optimized primarily for the carrier transport property.

The organic EL devices can be viewed as a diode which is forward biased when the anode is at a higher potential than the cathode. The anode and cathode of the organic EL device can each take any convenient conventional form, such as any of the various forms disclosed by Tang et al. U.S. Pat. No. 4,885,211. Operating voltage can be substantially reduced when using a low-work function cathode and a high-work function anode. The preferred cathodes are those constructed of a combination of a metal having a work function less than 4.0 eV and one other metal, preferably a metal having a work function greater than 4.0 eV. The Mg:Ag of Tang et al. U.S. Pat. No. 4,885,211 constitute one preferred cathode construction. The Al:Mg cathodes of VanSlyke et al. U.S. Pat. No. 5,059,062 are another preferred cathode construction. The use of a LiF/Al bilayer to enhanced electron injection in organic EL devices has been disclosed by Hung et al. in U.S. Pat. No. 5,776,622.

Conventional anodes are formed of a conductive and transparent oxide. Indium tin oxide has been widely used as the anode contact because of its transparency, good conductivity, and high work function. However, a device grown on a bare ITO surface generally shows insufficient hole injection and poor operational stability. The mitigation of these problems has involved introducing an intermediate layer between the ITO and the organic medium. Yang et al. reported a polymer EL device with improved charge carrier injection by using a polyaniline layer between the ITO and active electroluminescent layer. See "Enhanced performance of polymer light-emitting diodes using high-surface area polyaniline network electrodes" by Y. Yang, E. Westerweele, C. Zhang, P. Smith, and A. J. Heeger, Journal of Applied Physics Letters, Vol. 77, 694 (1995). VanSlyke et al. demonstrated a highly stable organic device formed by using a CuPc layer between the ITO and the hole-transporting layer. See "Organic electroluminescent devices with improved stability" by S. A. VanSlyke, C. H. Chen, and C. W. Tang, Applied Physics Letters, Vol. 69, 2160 (1996). We also found that the indium-tin-oxide (ITO) anode contact to an organic EL device can be significantly improved via oxygen plasma treatment without introducing a CuPc layer. The resulting device can be operated at low voltages, and exhibits good stability. The observation is consistent with the finding by Wu et al. in polymer light-emitting diodes. See "Surface modification of indium tin oxide by plasma treatment: an effective method to improve the efficiency, brightness, and reliability of organic light emitting devices" by C. C. Wu, C. I. Wu, J. C. Sturm, and A. Kahn, Applied Physics Letters, Vol. 70, 1348 (1997). Notwithstanding the foregoing, there is still a need to further enhance hole injection and improve operational stability of electroluminescent devices.

SUMMARY OF THE INVENTION

It is an object of the present invention to enhance hole injection and improve operational stability of electroluminescent devices.

It is a further object of the present invention to provide a method of forming an improved fluorocarbon layer in electroluminescent devices which has efficient hole injection/transport, good operating stability and improved current density.

This object is achieved in a method of forming an electroluminescent device comprising the steps of:
(a) providing a substrate having a top surface coating with a material including an anode having indium-tin-oxide; and
(b) forming an amorphous conductive layer over the anode by:
(i) providing a fluorocarbon gas in a radical source cavity and subjecting such fluorocarbon gas to a reduced pressure in a range of 0.1 to 20 MT;
(ii) applying an RF field across the fluorocarbon gas in the radical source cavity to form a plasma having $CF_x$ radicals;

(iii) depositing the $CF_x$ radicals onto the anode forming an amorphous $CF_x$ conductive polymer layer on the anode; and (iv) forming a plurality of layers over the amorphous $CF_x$ conductive polymer layer with such layers including at least one organic electroluminescent layer and a cathode over the electroluminescent layer.

The above method provides a novel deposition technique for producing electrically conductive amorphous fluorocarbon layers using the high-density RF radical source. This method is compatible and consistent with an automated approach to OLED fabrication.

The following are the advantages by using the present invention:

The radical source is operated at 13.56 MHz frequency and a very low gas pressure (0.1–30 mTorr) providing $CF_x$ films with very low roughness.

The radical source is mounted remotely from the substrate under treatment. The RF plasma is mainly confined inside the radical source. This ensures that the ion energy and the concentration of layer growth precursors are de-coupled from RF radical source plasma parameters. The ion energy bombardment across the sheath from the glow region of the plasma to the sensitive substrate is thus minimized.

Since the deposition pressure inside the reactor is very low 0.1–30 mTorr) as compared to 100–1000 mTorr in the conventional plasma enhanced chemical vapor deposition (PECVD), the incorporation of background unwanted species in the growing layer is also reduced.

The fluorocarbon layers produced by the radical source are distinct and have superior structural, optical, and electrical characteristics of than those prepared by a conventional RF plasma source. Non-conductive layers are limited to thicknesses in the 1 nm range because the prevailing current transport mechanisms would be tunneling limited, and the variability in reproducing these thicknesses from one device to another would be unacceptable as a stable OLED fabrication process.

Deposition of conducting fluorocarbon layer between ITO anode and the hole transport layer of the OLED device has decreased the drive voltage and significantly enhanced the operation stability of the device.

DETAILED DESCRIPTION OF THE PREFERRED EMBODIMENTS

Figure 1:
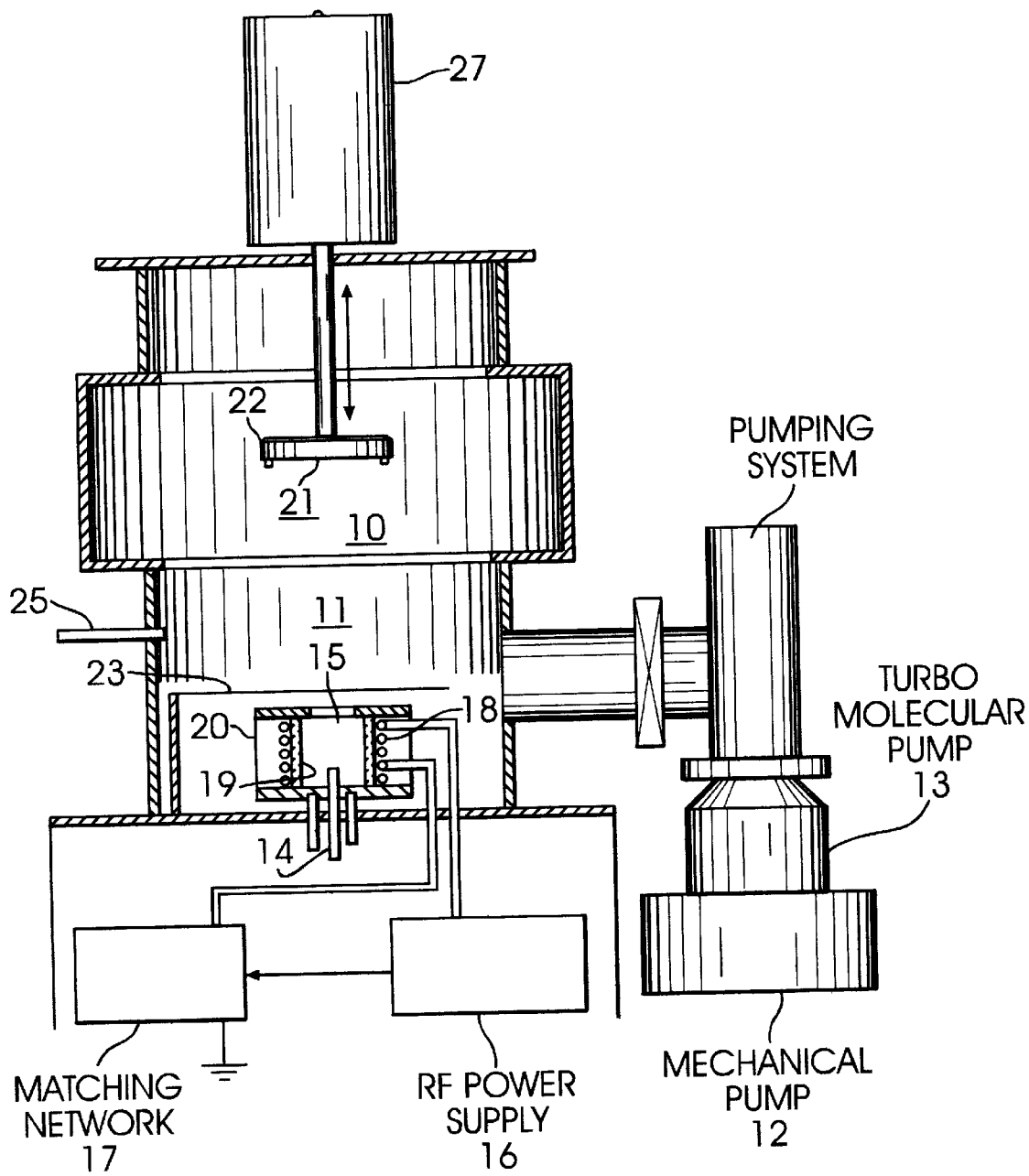
FIG. 1 is a schematic diagram of a plasma polymerization system used in this invention.

In the above cited commonly assigned U.S. patent application Ser. No. 09/191,705 to Hung et al., an improved electroluminescent device is described. The device has a substrate formed of an electrically insulating material, an organic medium for luminescence and a cathode formed over the organic medium. An anode is mounted on the substrate and has a conductive layer provided over the substrate and a fluorocarbon layer grown on the conductive layer.

Two kinds of fluorocarbon ($CF_x$) layers have been shown by Hung et al. previously, to have beneficial properties for OLED performance, using the plasma polymerization process of $CHF_3$ gas, namely, the non-conducting and the conducting varieties of layers. These layers were prepared in the conventional parallel plate (capacitance) type RF reactors. This type of reactor is also known as diode-type reactor. Hung et al. prepared conducting layers using a RF reactor where the RF power supply 16 frequency was 45 kHz, so called low frequency. However, when the same type of RF reactor was operated at a commonly used frequency of 13.56 MHz, the resulting layers were electrically non-conducting in nature. The thickness of such non-conducting layers were limited to less than 1 nm for any practical use in an OLED device.

These parallel plate RF plasma processes are called Plasma Enhanced Chemical Vapor Deposition (PECVD) and are characterized by complex interactions between neutral molecular and atomic species, and excited species. These excited species are ionized by-products of intermediate plasma chemical reactions and continuous ion and secondary electron bombardment of the gas within the plasma, substrates, layers being grown and the walls of the reactor. Of particular importance is the ion energy bombardment of the growing layer surface across the sheath. Therefore, the ion energy and the concentration of precursor layer growth gaseous species are coupled together with RF reactor parameters. These parameters include RF power, pressure, flow rates of feed gas, and the ratio of the powered electrode to the grounded electrode geometries, and whether the layer growth occurs on the grounded or powered electrode. This leads to poor control over the intrinsic properties of the growing layers and in addition, can cause the ion bombardment damage of substrates. The PECVD processes are generally operated in the 100–1000 mTorr pressure range. In fact, Hung et al. produced their $CF_x$ layers at a chamber pressure of 500 mTorr. Increasing pressure tends to improve the uniformity of deposition, but degrades the layer quality due to higher incorporation of background gases and contamination, and results in a porous morphology.

It has been found that these problems can be eliminated by using the inductively coupled high density radical source for depositing the fluorocarbon layers.

These radicals deposit on the conductive anode layer to form the fluorocarbon layer. The $CF_x$ radicals are generated inside a cylindrical cavity, where plasma is created by inductive RF coupling. These radicals then move and condense to deposit on the conductive layer to form a fluorocarbon layer on a remotely located substrate.

Quite unexpectedly, it has been found that fluorocarbon layers ($CF_x$) prepared using RF inductively coupled high density radical source operated at 13.56 MHz frequency, and at a very low chamber pressure of 0.1–20 mTorr have good transport properties as hole injection layers in OLED structures (conducting type), and have good optical and structural properties needed for OLED devices The layers made in accordance with the present invention are highly conductive and have excellent conformality, sufficient durability, and good adhesion to substrates. The process is considerably simpler than the conventional methods to fabricate conductive polymers.

$CF_x$ layers were deposited using the RF radical source operation with $CHF_3$ source gas, at pressure conditions of 0.1–20 mTorr (significantly lower than the conventional PECVD processes) and at a commonly used RF frequency of 13.56 MHz. The radical source is mounted remotely from the substrate under treatment. The $CF_x$ radicals were generated inside a cylindrical cavity, where plasma is created by inductive RF coupling. These radicals then move and condense to form a fluorocarbon layer on a remotely located substrate. This ensures that the ion energy and the concentration of layer growth precursors are de-coupled from RF radical source plasma parameters. The ion energy bombardment across the sheath from the glow region of the plasma to the substrate is minimized. Also, the layer growth mechanisms will be dominated by precursor radicals arriving at the substrate plane. Since the deposition pressure inside the reactor is low compared to conventional PECVD, the incorporation of background unwanted species in the growing layer is also reduced.

The other organic layers of the OLED device are deposited by evaporation of materials at a very low pressure in the $10E^6$ Torr range. The low pressure treatment using the radical source is consistent with the high vacuum deposition of OLED device in a single or multi-chamber vacuum deposition system and reduces the overall pumping time of the vacuum system after the substrate treatment.

Fluorocarbon Layer Preparation and Characterization

The conducting fluorocarbon $CF_x$ layers were prepared by using the inductively coupled high density RF radical source 20 and with $CHF_3$ source gas, at pressure conditions of 0.1–30 mTorr (significantly lower than conventional PECVD processes) and at a commonly used RF frequency of 13.56 MHz. The RF power level to the radical source was between 30–250 Watts. FIG. 1 shows the schematic diagram of a plasma deposition system used in this invention.

The radical source is mounted remotely from the substrate under treatment. The $CF_x$ radicals are generated inside a cylindrical cavity, where plasma is created by inductive RF coupling. These radicals then move and condense to form a fluorocarbon layer on a remotely located substrate.

It has been found that fluorocarbon layers ($CF_x$) prepared using RF inductively coupled radical source operated at 13.56 MHz frequency, and at a very low chamber pressure of 0.1–30 mTorr have good transport properties as hole injection layers in OLED structures (conducting type), and have good optical and structural properties needed for OLED devices.

Fluorocarbon layers with thickness of about 1–100 nm were deposited quartz, silicon and on an indium-tin oxide coated glass substrates. These layers were analyzed with x-ray photoelectron spectroscopy (XPS), infrared spectroscopy (IR), Rutherford backscattering spectrometry (RBS), ellipsometry and optical absorption spectroscopy, atomic force microscopy (AFM) and x-ray diffraction (XRD). These layers have good adhesion to the substrate and have good structural and optical properties.

Figure 4:
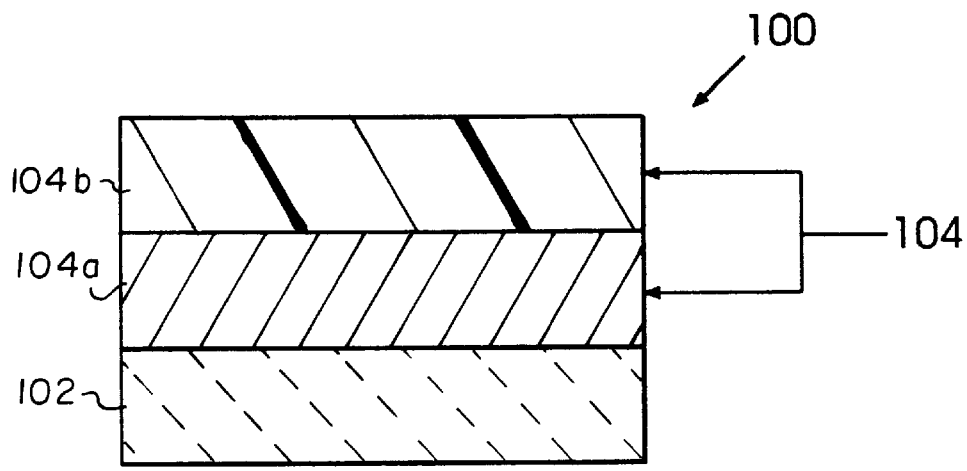
FIG. 4 is a schematic diagram of an embodiment of an electrode structure in accordance with the present invention.

Turning now to FIG. 1, there is shown a schematic diagram of a plasma deposition system 10 used in this invention to prepare conducting amorphous fluorocarbon overcoating layers 104b (see FIG. 4). The system 10 has a deposition chamber 11, a mechanical pump 12, and a turbomolecular vacuum pump 13 form the vacuum pumping system for the deposition chamber. Reactive gas inlet 14 such as $CHF_3$ and $O_2$ are introduced into the chamber via regulated flow controller and are fed to the radical source cavity 15. The radical source cavity 15 is powered by an RF supply connected to an induction coil 18. The RF matching network 17 is used to tune the RF power. The induction coil 18 is wound around the cylindrical quartz tube 19 which forms radical source 20 for generating the RF radicals. The induction coil 18 is water cooled using high resistivity deionized water supply. The radical source is surrounded by the RF ground shield 26. The gas flow rate and chamber pressure can be adjusted by flow meters. The pressure of the deposition chamber 11 is determined by several factors, including a gas flow rate entering the deposition chamber 11 and a gas flow rate extracted from the deposition chamber 11 by the pumping system comprising mechanical pump 12 and turbomolecular vacuum pump 13. The gas inlet 14 is used for feeding the $O_2$ and $CHF_3$ gas. The precise gas flow was controlled by separate mass flow controllers. The substrate 21 under the plasma treatment is positioned using the substrate holder 22. There also is provided a conventional shutter 23 to control the thickness deposition of the fluorocarbon layer on the substrate 21. When the shutter 23 is closed the radical source cavity 15 contains the $CF_x$ radicals. When the shutter 23 is open the $CF_x$ radicals deposit on an anode on the substrate 21. The formation of the anode will be discussed later. The system also include the alternative arrangement 27 for treating the substrate with RF plasma by conventional parallel plate configuration using the shutter and the substrate.

Figure 2:
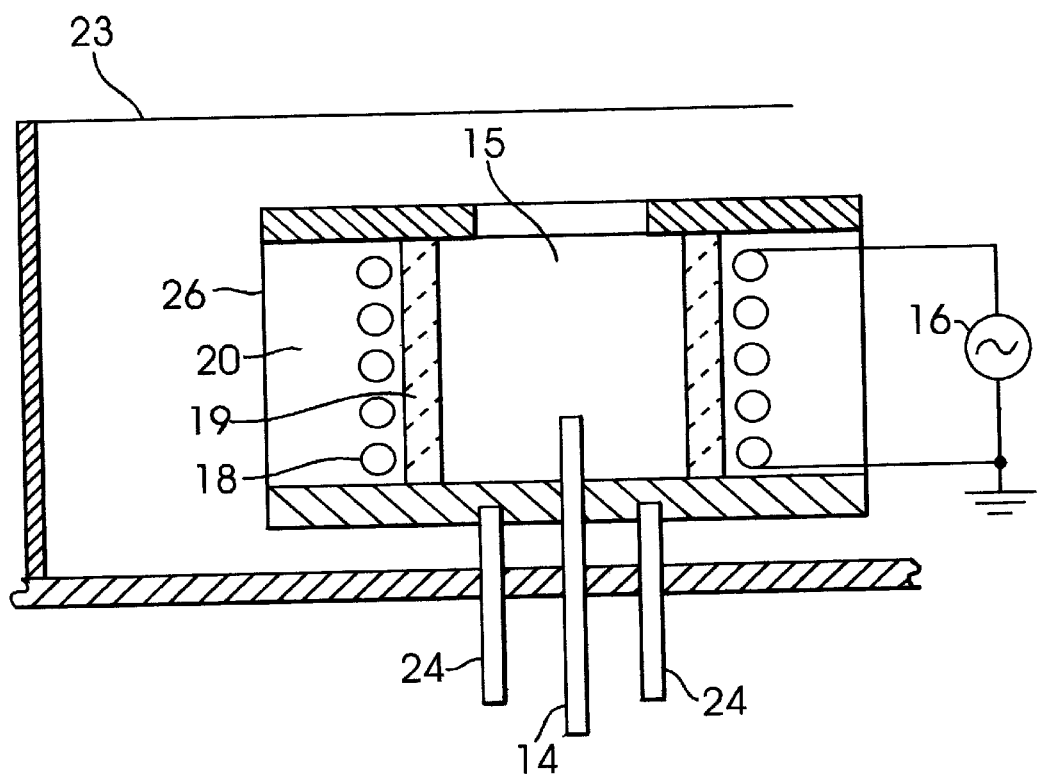
FIG. 2 is a schematic diagram of the inductively coupled high density Radical source of FIG. 1 used to generate the $CF_x$ radicals and the RF plasma in the plasma polymerization system.

The radical source 20 used to generate the $CF_x$ radicals and generate the RF plasma in the plasma polymerization system is described schematically in FIG. 2. The commercially available radical source includes an RF induction coil 18 and a shield case 26 and a radical source cavity 15 defined by high purity cylindrical quartz tube 19. The RF induction coil 18 is water cooled and is wound on the quartz tube 19. The source gas is inlet along the axis of the radical source cavity 15. The plasma is generated in the radical source cavity 15 by the spiral RF induction coil 18 and a field is produced by the RF power supply 16 which is coupled to an RF matching network 17. More particularly, RF power is supplied to the radical source cavity 15 from a commercial RF power supply 16 via an automatic RF matching network 17. The RF power can be varied between 30 to 250 W. The reflected RF power was minimized by matching RF network 17.

After the introduction of the substrate 21 in the plasma deposition system 10, the system was evacuated to pressure of about $1E^{-6}$ Torr, and then a flow of a $O_2$ gas was introduced into the radical source cavity 15. The plasma deposition system 10 pressure was determined by the feed-in rate of the gas and the pumping-out rate of the turbomolecular vacuum pump 13. The substrate 21 was first treated with $O_2$ plasma. Then $CHF_3$ was introduced into the plasma deposition system 10 after the shutter 23 was open to deposit the $CF_x$ layer using the radical source 20. The $CF_x$ deposition was conducted at a pressure of 0.1–20 mTorr. It is important to limit the gas pressure below 20 mTorr to achieve the high density of reactive $CF_x$ radicals inside the radical source cavity 15. Power of 30–250 W at a frequency of 13.56 MHz was used to generate the plasma inside the radical source cavity 15. The $CF_x$ radicals are generated inside the radical source cavity 15, where plasma is created by inductive RF coupling. These radicals then move and condense to form an amorphous fluorocarbon layer on the conductive anode 104a (see FIG. 5) of the remotely located substrate 21. The arrangement of the substrate and the radical source in the present invention is such that the substrate is at a floating potential. This ensures that the ion energy and the concentration of layer growth precursors are de-coupled from RF radical source plasma parameters. The ion energy bombardment across the plasma sheath from the glow region of the plasma to the substrate 21 is minimized. Also, the layer growth mechanisms will be dominated by precursor radicals arriving at the conductive anode 104a.

The amorphous fluorocarbon overcoating layers 104b can be prepared either using a single gaseous source selected from the group of $C_3F_8$, $C_4F_{10}$, $CHF_3$, $C_2F_4$, and $C_4F_8$, or using a dual gaseous source including one fluorocarbon gas having a high F/C ratio (for instance, $C_2F_6$ and $CF_4$) and one hydrogen or hydrocarbon gas to lower the F/C ratio for polymerization. The process can be further modified by the addition of $H_2$, $O_2$ or $N_2$ to a fluorocarbon plasma to achieve desired mechanical and physical properties.

X-ray diffraction spectra of the $CF_x$ layers prepared using the radical source 20 of the present invention did not have any crystallinity and were found to be amorphous in nature. These $CF_x$ layers have exhibited high electrical conductivity with a value of $10^{-6}$–$10^{-7}$ $(ohm-cm)^{-1}$.

These $CF_x$ layers were characterized by Rutherford backscattering spectrometry (RBS), X-ray photoelectron spectroscopy (XPS) and Infra-red spectroscopy (FTIR). RBS showed the presence of carbon and fluorine and did not indicate any impurities, indicating that the electrical conducting nature of the $CF_x$ layers is not caused by any foreign impurities. The XPS and IR showed the presence of functional groups having $CF_3$, $CF_2$, CF and C—CF and CH components. The ratio of C:F in the radical source prepared $CF_x$ layer is close to a unity, indicating a high degree of incorporated —C—F functional groups, and therefore a significant amount of dangling bonds.

Atomic force microscopy (AFM) photographs were made of the 100 nm thick layers deposited on silicon substrates 21 using the conventional RF parallel plate reactor and the radical source 20. The surface of the amorphous fluorocarbon overcoating layer 104b prepared by the radical source 20 was very smooth and had a significantly lower root mean square (RMS) roughness as compared to that prepared by the conventional RF parallel plate reactor at a higher deposition pressure.

Figure 3:
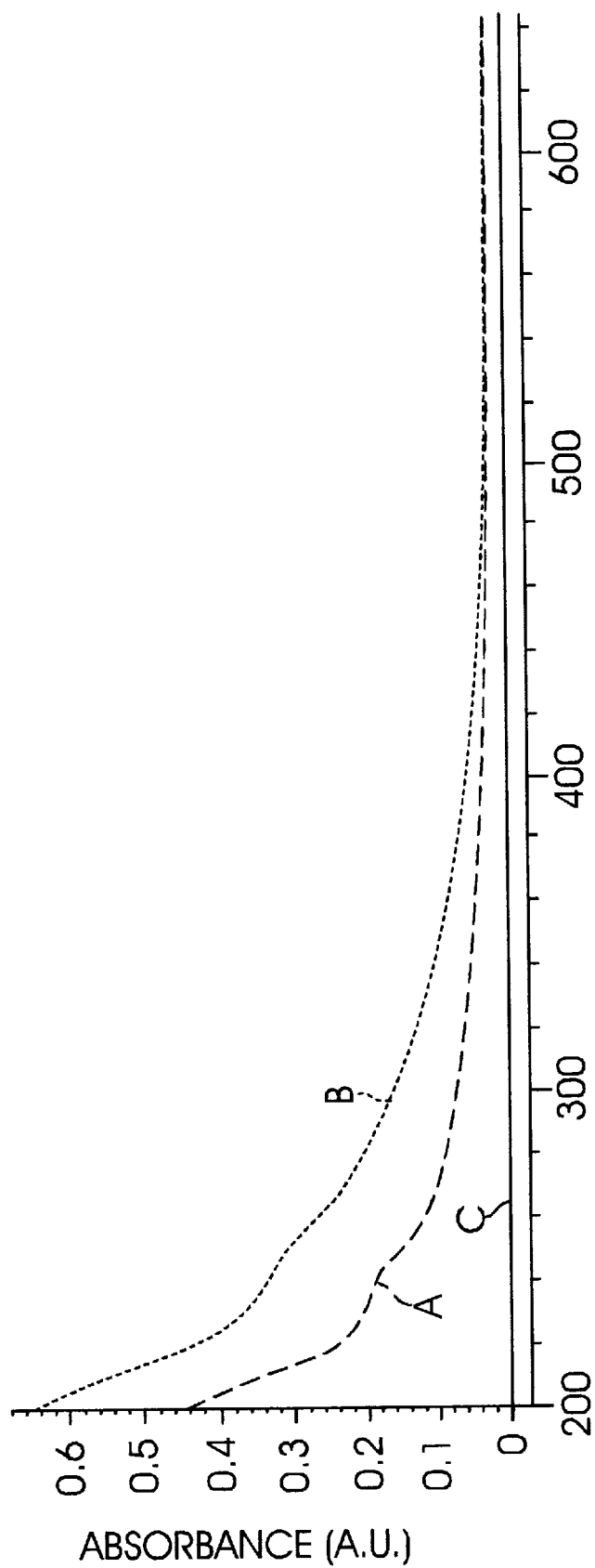
FIG. 3 shows the optical absorption spectra of 100 nm thick layers deposited on quartz substrates.

FIG. 3 shows the optical absorption spectra of two 100 nm thick layers deposited on quartz substrates 21. Curve A is the optical absorption absorption due to 100 nm thick $CF_x$ layer deposited using a conventional RF plasma source. Curve B is for the layer prepared using the inductively coupled radical source 20 of the present invention. Curve C is the optical absorption of the quartz substrate. The conducting layer deposited using the radical source 20 has significantly higher absorption between 200–400 nm wavelength region than the same thickness of the non-conducting layer deposited using the conventional parallel plate reactor. It is quite noticeable that the optical absorption in the conducting layer prepared by the radical source 20 extends well above the 500 nm wavelength, indicating that the presence of trap states in the $CF_x$ layer, which may be responsible for the conducting nature of this layer.

Several EL devices were prepared by depositing 0.5 to 50 nm thick $CF_x$ layers using the radical source, on the ITO anode using constant flow rates of $CHF_3$ gas, preceded by an $O_2$ RF plasma treatment in the parallel plate reactor mode or using the radical source 20 using $O_2$ gas. It has been found that these devices have excellent current-voltage characteristics as compared to the devices treated with $O_2$ and $CF_x$ non-conducting layers (~1 nm) prepared using the parallel plate reactor operated at 13.56 MHz. Also these devices possess high operational stability and efficient hole transport properties. The drive voltage was significantly reduced (especially at high current densities) and the room temperature operational stability measured at a current density of 71 $mA/cm^2$ was significantly improved in comparison with devices that did not have $CF_x$ interface layers.

An electrode structure 100 according to the invention is schematically illustrated in FIG. 4. The substrate 102 is an electrically insulating and optically transparent material such as glass or plastic. Over the substrate 102 is an anode 104a and an amorphous fluorocarbon overcoating layer 104b. This structure provide for efficient hole injection in organic EL devices formed by polymer or small-molecule organic materials, as exemplified in FIG. 5.

Figure 5:
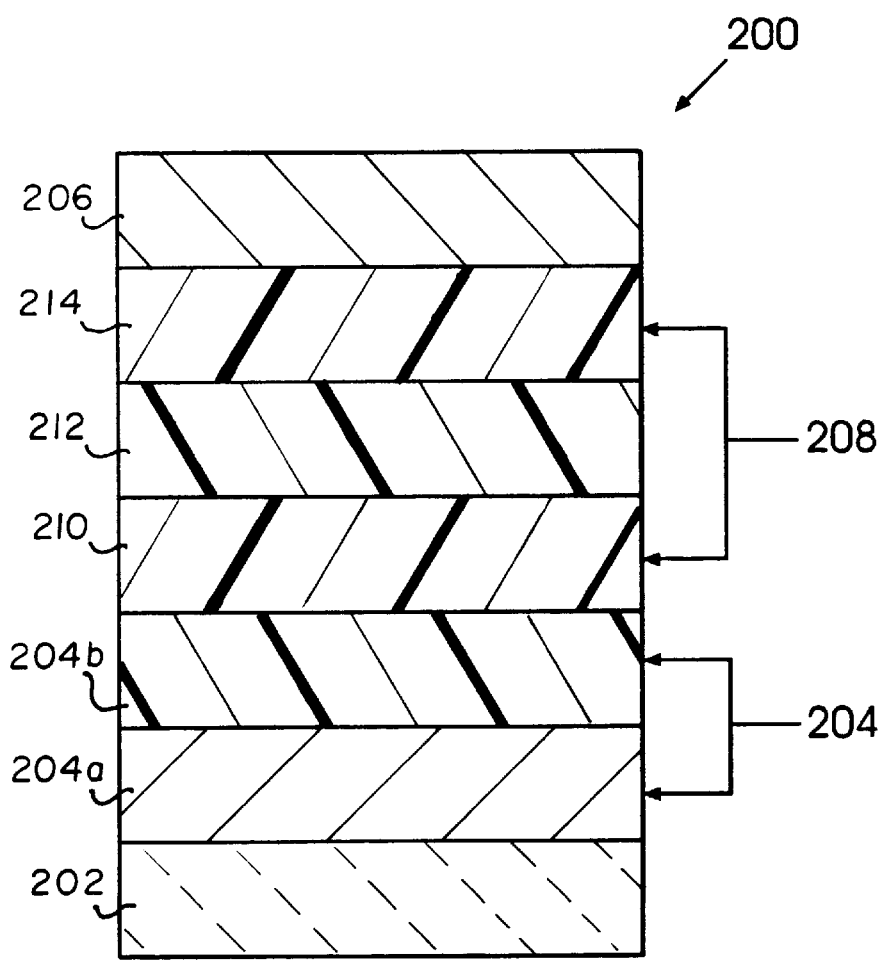
FIG. 5 is a schematic diagram of an organic electroluminescent device having a multilayer electrode in accordance with the present invention.

In FIG. 5, an organic electroluminescent device structure 200 is illustrative which uses a multilayer device in accordance with the present invention. Substrate 202 can be formed of the same materials described with respect to substrate 102 (FIG. 4). A conductive anode 204a is formed on the substrate 202 and has a substantial indium tin oxide component. Over the anode 204a there is an amorphous fluorocarbon overcoating layer 204b. The anode 204a is separated from a cathode 206 by an electroluminescent medium 208, which includes three superimposed layers. Located on top of the anode 204a are, in sequence, an organic hole transporting layer 210, an organic electroluminescent layer 212, and an organic electron transporting layer 214. It is also understood that the electroluminescent medium 208 can be a single layer or a bilayer comprising an organic hole transporting layer 210 and an organic electron transporting layer 214. In such a configuration, there is provided an efficient site for the recombination of the injected hole-electron pair and resultant electroluminescence. It will also be understood that the electroluminescent medium 208 can include more than three layers.

The substrate 102 for electrode structure 100 shown in FIG. 4 and the substrate 202 for organic electroluminescent device structure 200 shown in FIG. 5 are electrically insulated and can either be light transmissive or opaque. The light transmissive property is desirable for viewing the EL emission through the substrate. For applications where the EL emission is viewed through the top electrode, the transmissive characteristic of the support is immaterial, and therefore any appropriate substrate such as opaque semiconductor and ceramic wafers can be used. Of course, it is necessary to provide in these device configurations a light transparent top electrode.

The multilayer electrodes 104 (see FIG. 4) and 204 (see FIG. 5), respectively, are formed of conductive anodes 104a and 204a and amorphous fluorocarbon overcoating layers 104b and 204b. The light transparent property of the anodes 104a and 204a is desirable for viewing the EL emission through the substrate. For applications where the EL emission is viewed through the top electrode, the transmissive characteristic of the anodes 104a and 204a is immaterial, and therefore any appropriate materials such as an opaque metal or metal compound having a work function greater than 4.1 eV can be used. The metals include gold, iridium, palladium, and platinum. The conductive and transmissive layer can be selected from the group of metal oxides, nitrides such as gallium nitride, selenides such as zinc selenide, and sulfides such as zinc sulfide. The suitable metal oxides include indium-tin oxide, aluminum- or indium-doped zinc oxide, tin oxide, magnesium-indium oxide, nickel-tungsten oxide, and cadmium-tin oxide.

After formation of the conductive layer, a layer mainly made of an amorphous fluorocarbon overcoating layers 104b and 204b is formed on the conductive anodes 104a and 204a, respectively. This fluorocarbon layer formed using the radical source is an essential part in this invention. It adheres well to the conductive layer and forms a buffer layer between the conductive layer and the hole transporting layer, thus significantly improving device operational stability. The surface of the aforementioned conductive layer may be processed beforehand to improve its adhesion to the fluorocarbon overcoating layer. The types of processing include sputtering processing, corona processing, UV irradiation, or oxygen plasma treatment.

The thickness of the fluorocarbon is so selected that it would have a full coverage on the underlying conductive layer, and that its series resistance would not significantly affect device performance. A useful range of the thickness is from 1 to 100 nm, preferably 1–60 nm.

The composition of the EL medium is described as follows, with reference to device structure 200. The hole transporting layer of the organic EL device contains at least one hole transporting aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monarylamine, diarylamine, triarylamine, or a polymeric arylamine. Exemplary monomeric triarylamines are illustrated by Klupfel et al. U.S. Pat. No. 3,180,730. Other suitable triarylamines substituted with vinyl or vinyl radicals and/or containing at least one active hydrogen containing group are disclosed by Brantley et al. U.S. Pat. Nos. 3,567,450 and 3,658,520.

The electroluminescent layer of the organic EL device comprises of a electroluminescent or fluorescent material where electroluminescence is produced as a result of electron-hole pair recombination in this region. In the simplest construction, the electroluminescent layer comprises of a single component, that is a pure material with a high fluorescent efficiency. A well known material is tris (8-quinolinato) aluminum, (Alq), which produces excellent green electroluminescence. A preferred embodiment of the electroluminescent layer comprises a multi-component material consisting of a host material doped with one or more components of fluorescent dyes. Using this method, highly efficient EL devices can be constructed. Simultaneously, the color of the EL devices can be tuned by using fluorescent dyes of different emission wavelengths in a common host material. This dopant scheme has been described in considerable details for EL devices using Alq as the host material by Tang et al. in U.S. Pat. No. 4,769,292.

Preferred materials for use in forming the electron transporting layer of the organic EL devices of this invention are metal chelated oxinoid compounds, including chelates of oxine itself (also commonly referred to as 8-quinolinol or 8-hydroxyquinoline). Such compounds exhibit both high levels of performance and are readily fabricated in the form of thin layers.

The organic EL devices of this invention can employ a cathode constructed of any metal having a work function lower than 4.0 eV, such as calcium, lithium and magnesium. Unexpected fabrication, performance, and stability advantages have been realized by forming the cathode of a combination of a low work function metal and at least one other metal. For further disclosure, see U.S. Pat. No. 4,885,211 by Tang and Van Slyke, the disclosure of which is incorporated by reference herein. A bilayer structure of LiF/Al has been used to enhance electron injection, as disclosed in U.S. Pat. No. 5,776,622 by Hung et al.

EXAMPLES

Figure 6:
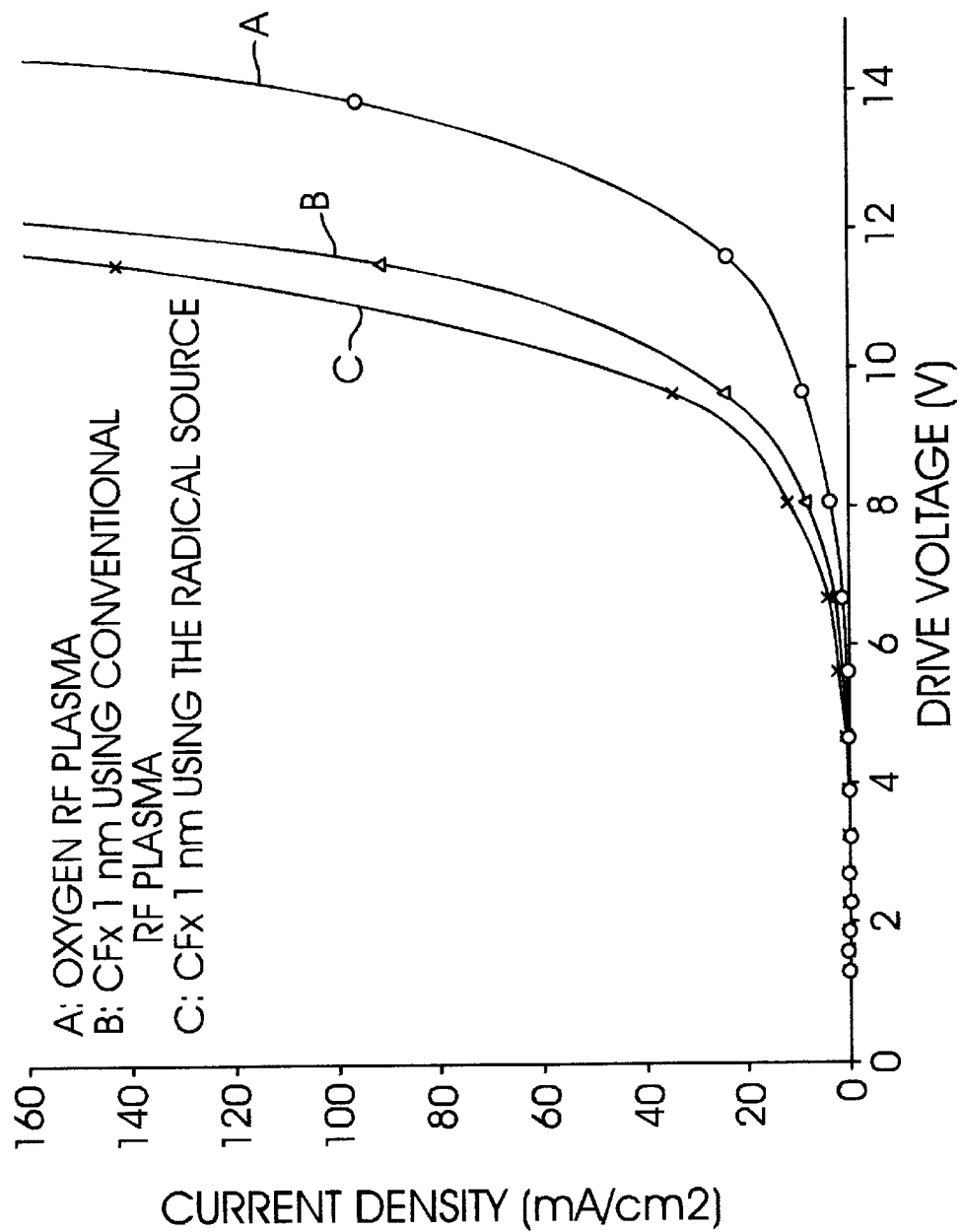
FIG. 6 shows plots of current density versus drive voltage for a series of devices.

The invention and its advantages are further illustrated by the specific examples: In all the examples (except the prior art example), the fluorocarbon polymer was made using the RF radical source using the fluorocarbon gas. In FIG. 6 there are three plots: A) with a prior art oxygen plasma-treated ITO anode, B) a prior art, with 1 nm $CF_x$ on ITO anode deposited using conventional RF plasma, and C) with 1 nm $CF_x$ on ITO anode made in accordance with the present invention.

Example 1

(Prior Art)

An EL device was constructed in the following manner. The EL medium has three organic layers, namely, NPB (4,4'-bis-[N-(1-naphthyl)-N-phenylamino]-bi-phenyl (hole transporting layer)), a hole transporting layer, Alq with C545T dopant emission layer and Alq, an electron transporting layer.

The top surface of a glass substrate was coated with an 80 nm indium-tin-oxide (ITO). These coated substrates were sequentially ultrasonicated in a commercial detergent, rinsed in deionized water, degreased in toluene vapor. These substrates were then transferred to the load chamber of the multi-chamber vacuum deposition system.

(a) The substrate was then moved to the pre-treatment chamber and treated with oxygen plasma for one minute at 100 W power, 80 mTorr $O_2$ pressure using the conventional parallel plate RF plasma source.

(b) Onto the ITO layer was deposited a hole transporting layer of N,N'-bis-(1-naphthyl)-N,N'-diphenylbenzidine (150 nm), also by evaporation.

(c) An emission layer of Alq (37.5 nm) with 0.5% C545T dopant was deposited on the NPB layer.

(d) An electron transporting layer of Alq (37.5 nm) was then deposited onto the emission layer.

(e) On top of the Alq electron transport layer was deposited a cathode layer (200 nm) formed of a 10:0.5 atomic ratio of Mg and Ag.

The above sequence completed the deposition of the EL device. The device was then hermetically packaged in a dry glove box filled with nitrogen for protection against ambient environment.

Example 2
(Prior Art)

Another EL device was constructed in the following manner.

(a) The clean substrate was pre-treated with oxygen plasma for one minute at 100 W, 80 mTorr $O_2$ pressure for one minute using the conventional parallel plate RF plasma source.

(b) The $O_2$ supply to the parallel plate reactor was turned off and the system was pumped down. Then $CHF_3$ gas was introduced. The $CF_x$ thin layer of 1 nm prepared using the conventional parallel plate reactor was deposited on the ITO surface. The RF frequency for this reactor was 13.56 MHz, the RF power was 100 Watts and the CHF3 pressure inside the chamber was 88 mTorr.

(c) Other organic layers, a hole transport layer, AlQ emission layer with a C545T dopant and AlQ electron transport layer, and a cathode layer were deposited sequentially to complete the EL device as above. The device was then encapsulated.

Example 3
(Present Invention)

Another device was prepared using the following manner.

a) The ITO coated substrate was moved to the pre-treatment chamber of the multi-chamber vacuum deposition system. Then it was first pre-treated with oxygen plasma for one minute at 100 W and 80 mTorr pressure using the parallel plate RF plasma source.

(b) Then $CHF_3$ gas was introduced inside the chamber and the radical source was turned on. The $O_2$ gas was turned off. After the plasma inside the radical source was stabilized and the $O_2$ flow reduced to zero, the ITO surface was coated with $CF_x$ thin layer of 1 nm prepared using the inductively coupled high density Radical source. The RF power supply to the radical source is operated at 13.56 MHz frequency. The power to the radical source was 100 W and the $CHF_3$ pressure inside the chamber was 3.6 mTorr.

(c) The substrate was then moved to the other chambers for depositing hole transport layer, emission layer, electron transport layer and cathode layer as described above in Example 2.

The above three devices were then hermetically packaged in a nitrogen containing dry glove box for protection against ambient environment. These devices were tested for current voltage characteristics and the electroluminescence yield. The current voltage characteristics for the device of the Examples 1, 2 and 3 are given by Curves A, B, C, respectively, in FIG. 6. It shows the current output of the three devices as a function of applied voltage. The results clearly indicate that an inventive device with a fluorocarbon-coated ITO anode can be operated at lower voltages and exhibits higher EL output at a fixed voltage, as compared to the prior art devices disclosed in Examples 1 and 2. This result was unexpected. The drive voltage for device treated with $O_2$ plasma was 11.7 V at a current density of 20 mA/cm$^2$. The drive voltage for device of Example 2 prepared with 1 nm non-conducting $CF_x$ was 10.6 V when it was operated 20 mA/cm2 current density. The drive voltage for device of Example 3 prepared using the radical source is 7.8 V at a current density of 20 mA/cm$^2$. And is lowest among these three devices The luminescence for this device was when it was operated 71 mA/cm$^2$ current was found to be comparable with that disclosed in Example 2.

Example 4

Figure 7:
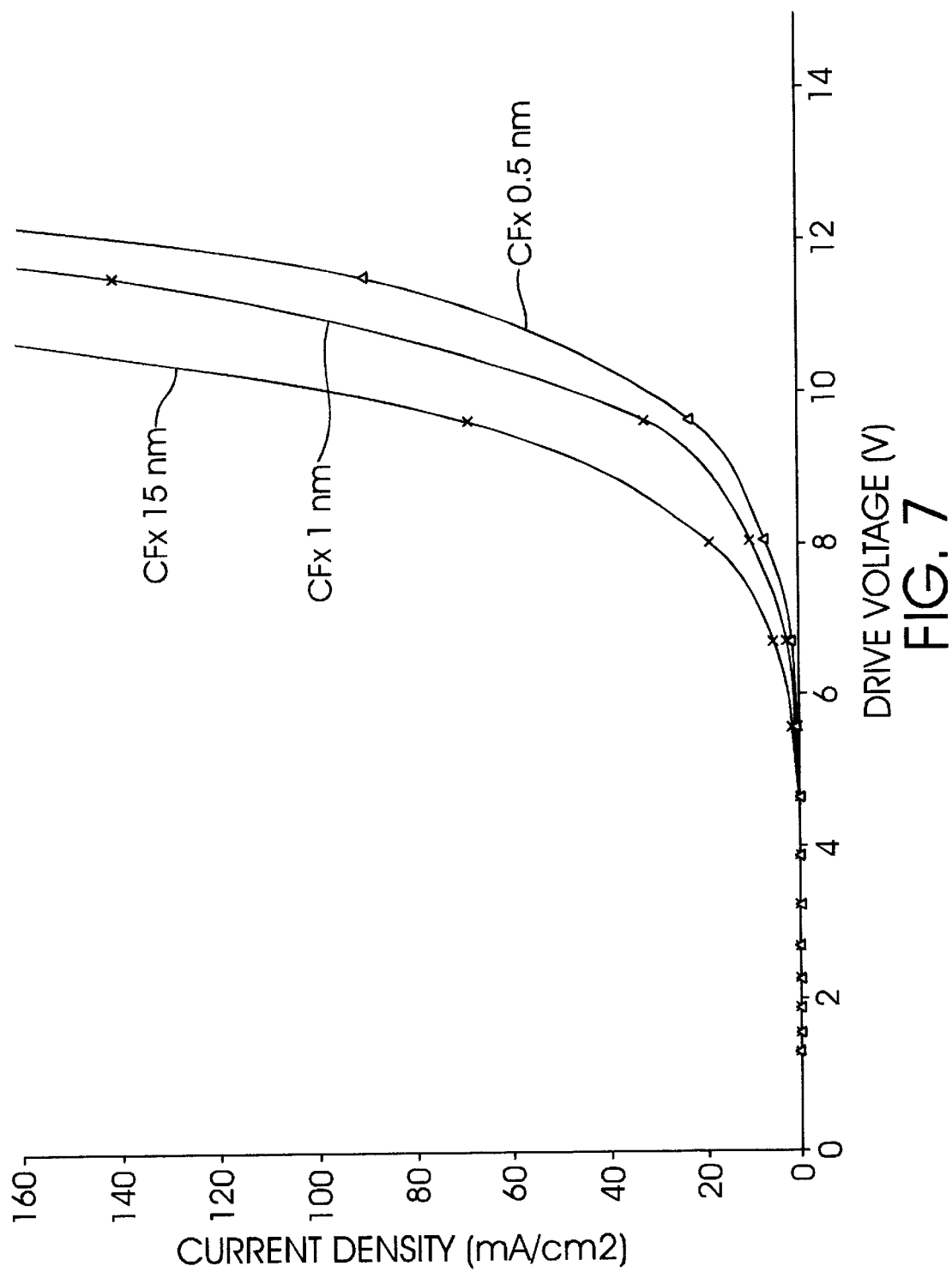
FIG. 7 shows plots of current density versus drive voltage for a series of devices using electrode made in accordance with the present invention.

Several EL devices satisfying the requirements of the invention were prepared by following the procedure in Example 3 and by varying the thickness of the $CF_x$ layer prepared using the radical source from 0.5 nm to 50 nm. FIG. 7 shows current output of the three devices with $CF_x$ thickness of 0.5 nm, 1 nm, and 15 nm as a function of applied voltage. The results clearly indicate that an inventive device with a fluorocarbon-coated ITO anode can be operated at lower voltages and exhibits higher EL output at a fixed voltage. This result was unexpected.

Figure 8:
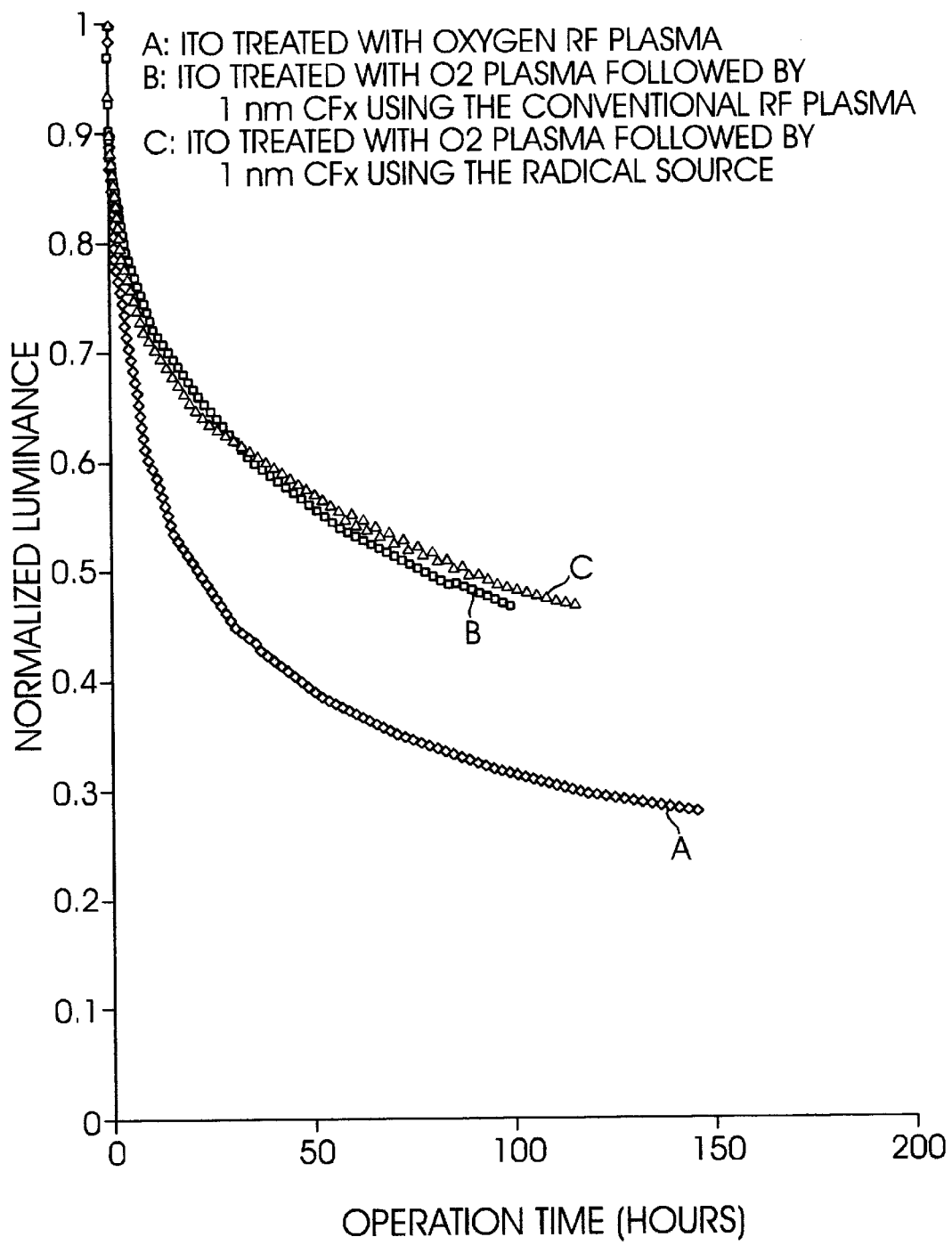
FIG. 8 shows the operational stability of the three devices as a function time.
Figure 9:
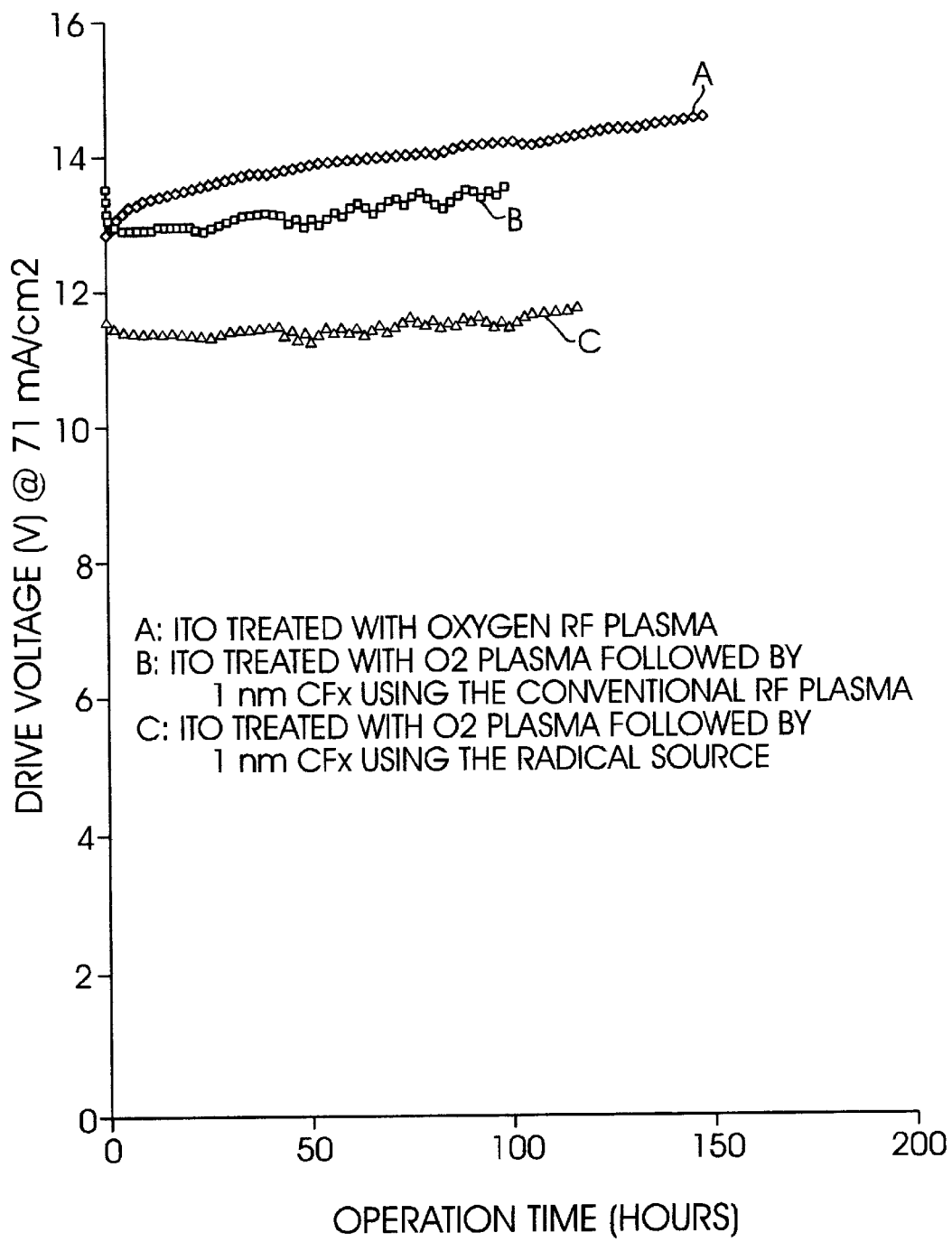
FIG. 9 shows the drive voltage stability as a function of time for a series of devices.

We have also measured the operational stability of the encapsulated devices by measuring the changes in the drive voltage and the luminance as a function of time when the device was operated at a constant current density of 71 mA/cm2. FIGS. 8 and 9 show the operational stability of the luminance and drive voltage measured as a function time for three devices shown in Examples 1, 2 (prior art), and 3 (present invention). Example 1 with $O_2$ treatment of ITO surface, Example 2 with 1 nm fluorocarbon layer prepared by conventional RF parallel plate source and Example 3 with 1 nm fluorocarbon layer prepared by Radical gun. The normalized luminance was stable for a longer time for the device of this invention.

FIG. 9 shows the operation stability of the drive voltage as a function of time for the devices of FIG. 8. It was found that the drive voltage for the device of Example 3 (Curve C of FIG. 9) as prepared in accordance with the present invention has much lower voltage and higher stability than the other two devices of Examples 1 and 2 (Curve A and B of FIG. 9).

Figure 10:
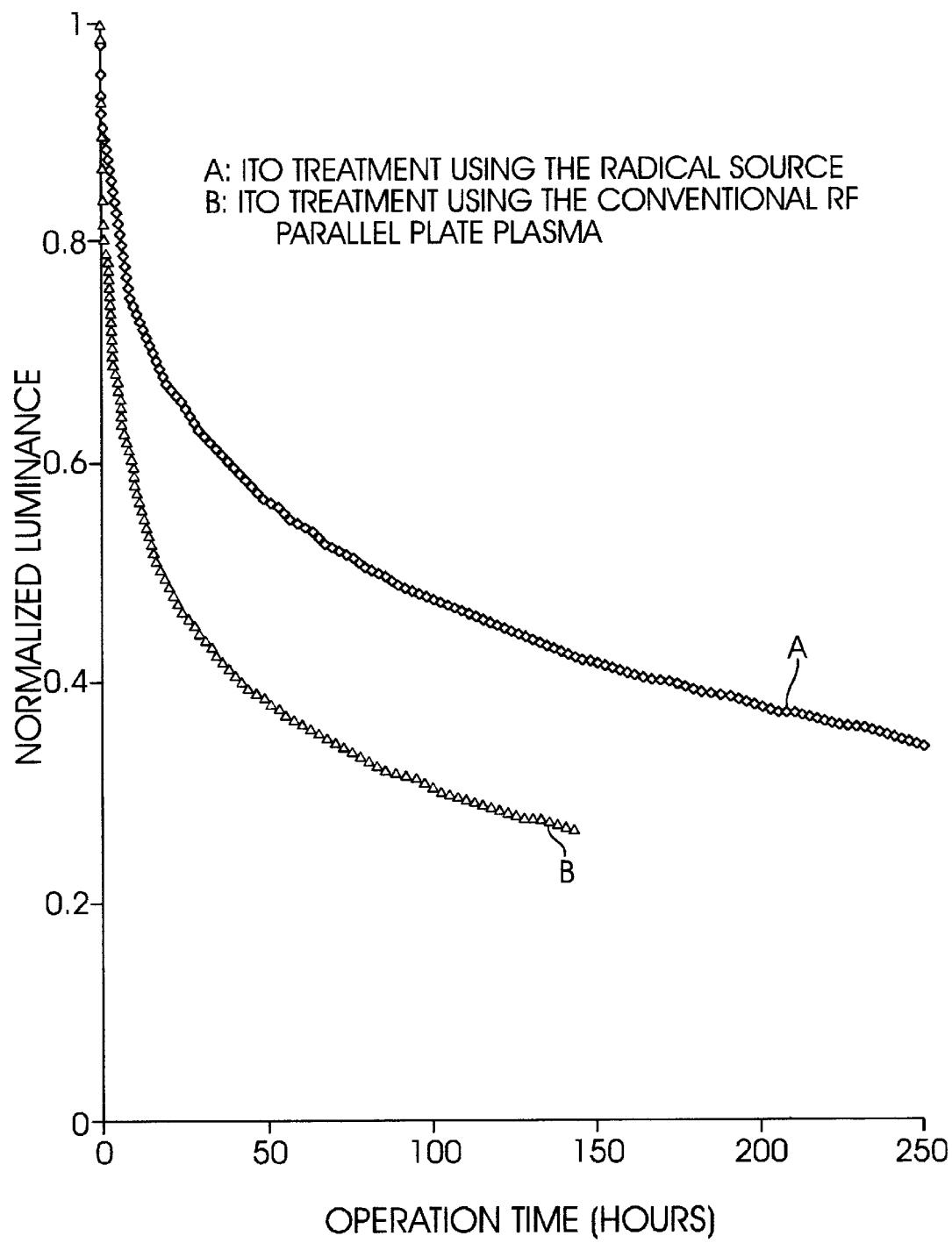
FIG. 10 shows plots of relative luminescence versus time when the indium tin oxide anode was surface cleaned with an oxygen plasma in two separate arrangements.

It has been also found that treating the ITO surface with Radical source has advantage of improving the performance of the device stability. The operational stability of the two devices were compared in FIG. 10. The ITO anode surface of the two devices were treated in $O_2$ plasma using the Radical source and the conventional RF parallel plate source, respectively. For treating the first device, the power for the radical source was 100 W, $O_2$ pressure was 7.6 mTorr and the treatment time was 1 minute. The second device was treated for the same time of 1 minute using the conventional RF plasma at the conditions: RF power, 100 Watts and $O_2$ pressure 80 mTorr. FIG. 10 shows the electroluminescence stability of these two devices. It clearly indicates that the device treated with oxygen plasma using the radical source (FIG. 10, Curve A) has much better operation stability than the device where ITO surface was treated with $O_2$ plasma using the RF parallel plate (FIG. 10, Curve B).

The operational stability of the $O_2$ treated devices can further be improved by depositing $CF_x$ layer using the radical source. The ITO anode surface of the two different substrates were treated in $O_2$ plasma using the radical source and the conventional RF parallel plate arrangement, respectively as described above. This was then followed by deposition of 10 nm $CF_x$ layers using the radical source. The operational luminance stability of the these devices are compared in FIG. 11. It is obvious that the device subjected to radical source treatment for both $O_2$ and $CF_x$ steps (FIG. 11, Curve A) has much higher operational stability.

Figure 11:
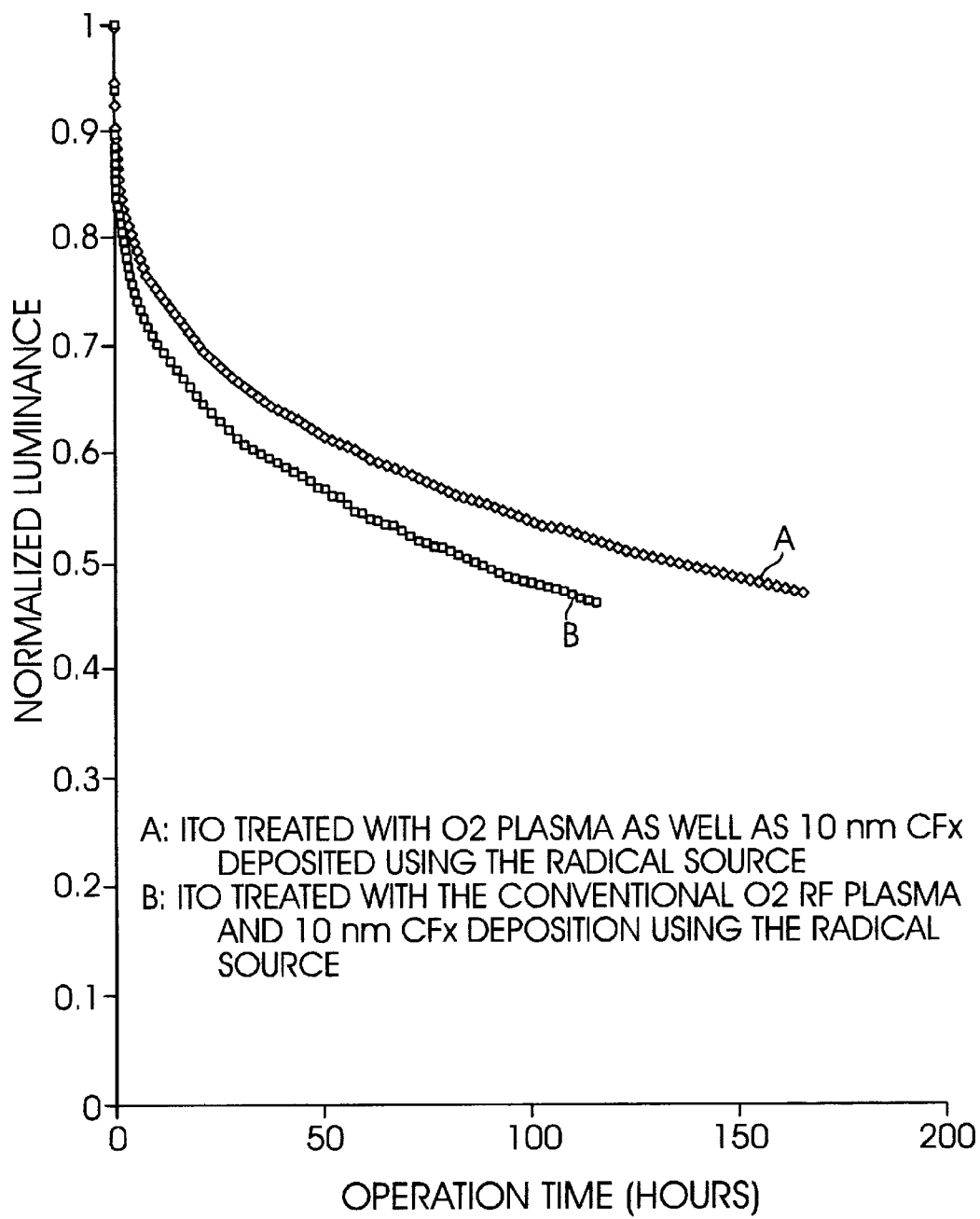
FIG. 11 shows plots of relative luminescence versus time when the indium tin oxide anode was surface cleaned with an oxygen plasma in two separate arrangements followed by fluorocarbon layer prepared in accordance with the present invention.
Figure 12:
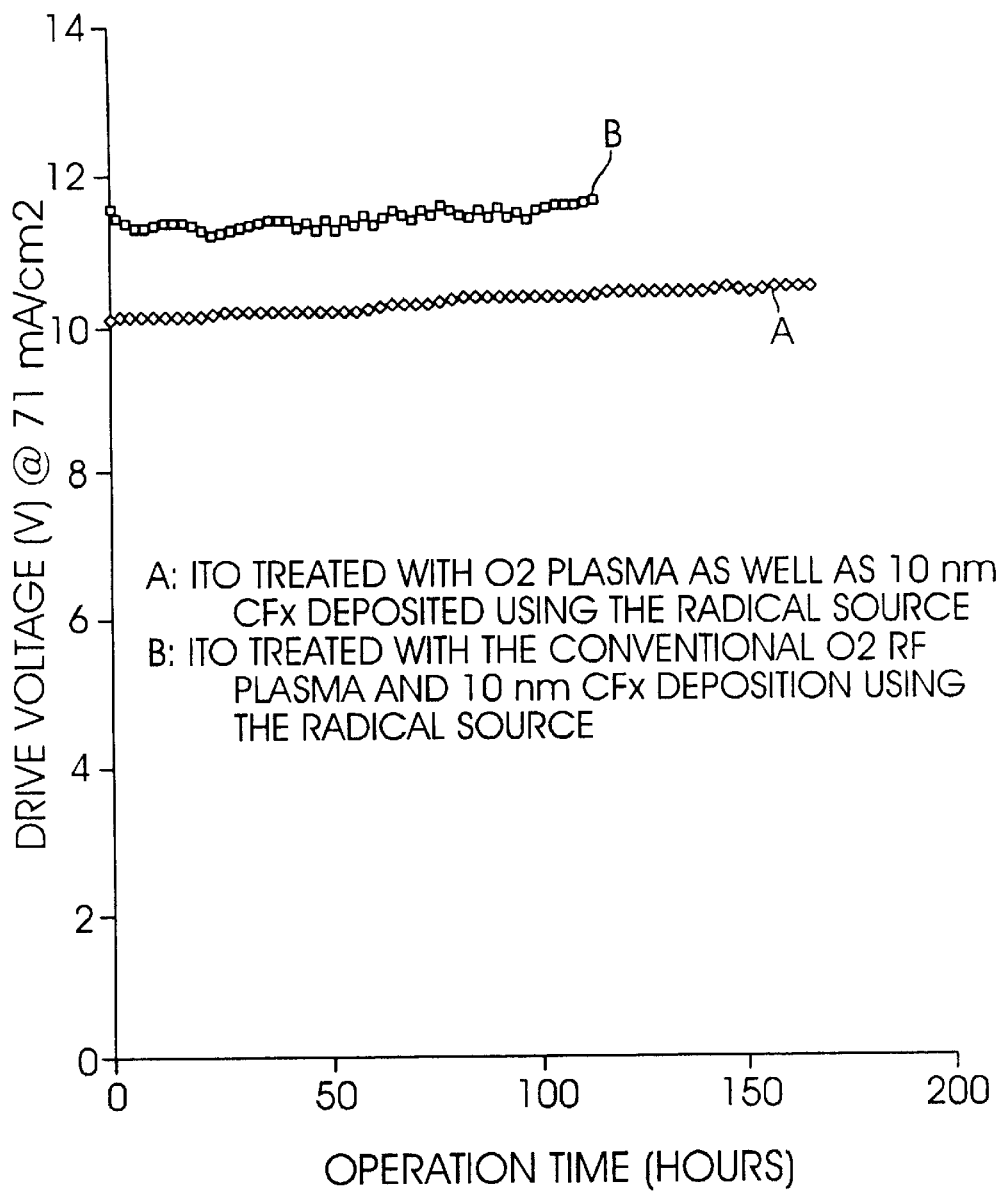
FIG. 12 shows plots of voltage versus time of the $CF_x$ conductive polymer layers corresponding to the plots shown in FIG. 11.

FIG. 12 shows the drive voltage operation stability of the two devices of FIG. 11. It is clearly seen that the device subjected to radical source treatment for both $O_2$ and $CF_x$ steps (FIG. 12, Curve A) has lower drive voltage and much higher operational stability.

The invention has been described in detail with particular reference to certain preferred embodiments thereof, but it will be understood that variations and modifications can be effected within the spirit and scope of the invention.

PARTS LIST

| | |
|---|---|
| 10 | plasma deposition system |
| 11 | deposition chamber |
| 12 | mechanical pump |
| 13 | turbomolecular vacuum pump |
| 14 | reactive gas inlet |
| 15 | radical source cavity |
| 16 | RF power supply |
| 17 | RF matching network |
| 18 | RF induction coil |
| 19 | cylindrical quartz tube |
| 20 | radical source |
| 21 | substrate |
| 22 | substrate holder |
| 23 | shutter |
| 24 | water cooling |
| 25 | gas inlet |
| 26 | RF ground shield for the radical source |
| 27 | arrangement for treating the substrate with RF plasma using the conventional parallel plate type electrode structure |
| 100 | electrode structure |
| 102 | substrate |
| 104 | electrode |
| 104a | conductive anode |
| 104b | amorphous fluorocarbon overcoating layers |
| 200 | organic electroluminescent device structure |
| 202 | substrate |
| 204 | electrode |
| 204a | conductive anode |
| 204b | fluorocarbon overcoating layer |
| 206 | cathode |
| 208 | electroluminescent medium |
| 210 | organic hole transporting layer |
| 212 | organic electroluminescent layer |
| 214 | organic electron transporting layer |

What is claimed is:

1. A method of forming an electroluminescent device comprising the steps of:
   (a) providing a substrate having a top surface coating with a material including an anode having indium-tin-oxide; and
   (b) forming an amorphous conductive layer over the anode by:
      (i) providing a fluorocarbon gas in a radical source cavity and subjecting such fluorocarbon gas to a reduced pressure in a range of 0.1 to 20 mTorr;
      (ii) applying an RF field across the fluorocarbon gas in the radical source cavity to form a plasma having $CF_x$ radicals;
      (iii) depositing the $CF_x$ radicals onto the anode forming an amorphous $CF_x$ conductive polymer layer on the anode; and
      (iv) forming a plurality of layers over the amorphous $CF_x$ conductive polymer layer with such layers including at least one organic electroluminescent layer and a cathode over the electroluminescent layer.

2. The method of claim 1 wherein the amorphous $CF_x$ conductive polymer layer has a thickness in a range of 0.5 to 50 nm.

3. The method of claim 1 wherein the substrate is remotely located relative to the radical source cavity and wherein the depositing step includes opening a shutter to permit the $CF_x$ radicals to deposit from the radical source cavity to the anode.

4. A method of forming an electroluminescent device comprising the steps of:
   (a) providing a substrate having a top surface coating with a material including an anode having indium-tin-oxide;
   (b) treating the anode with an oxygen plasma; and
   (c) forming an amorphous conductive layer over the anode by:
      (i) providing a fluorocarbon gas in a radical source cavity and subjecting such fluorocarbon gas to a reduced pressure in a range of 0.1 to 20 mTorr;
      (ii) applying an RF field across the fluorocarbon gas in the radical source cavity to form a plasma having $CF_x$ radicals;
      (iii) depositing the $CF_x$ radicals onto the anode forming an amorphous $CF_x$ conductive polymer layer on the anode; and
      (iv) forming a plurality of layers over the amorphous $CF_x$ conductive polymer layer with such layers including at least one organic electroluminescent layer and a cathode over the electroluminescent layer.

5. The method of claim 4 wherein the oxygen plasma is formed in the radical source cavity.

6. The method of claim 4 wherein the amorphous $CF_x$ conductive polymer layer has a thickness in a range of 0.5 to 50 nm.

7. The method of claim 4 wherein the substrate is remotely located relative to the radical source cavity and wherein the depositing step includes opening a shutter to permit the $CF_x$ radicals to deposit from the radical source cavity to the anode.

* * * * *